(12) United States Patent
Franklin

(10) Patent No.: US 10,019,042 B1
(45) Date of Patent: Jul. 10, 2018

(54) SERVER USING SINGLE BOARD COMPUTER

(71) Applicant: David Franklin, Fairfax, VA (US)

(72) Inventor: David Franklin, Fairfax, VA (US)

( * ) Notice: Subject to any disclaimer, the term of this patent is extended or adjusted under 35 U.S.C. 154(b) by 0 days.

(21) Appl. No.: 15/621,027

(22) Filed: Jun. 13, 2017

(51) Int. Cl.
| | |
|---|---|
| *G06F 1/18* | (2006.01) |
| *H05K 7/14* | (2006.01) |
| *G06F 13/40* | (2006.01) |
| *H02B 1/34* | (2006.01) |
| *H05K 7/18* | (2006.01) |
| *H04Q 1/02* | (2006.01) |

(52) U.S. Cl.
CPC ............. *G06F 1/181* (2013.01); *G06F 13/40* (2013.01); *H02B 1/34* (2013.01); *H05K 7/1491* (2013.01); *H05K 7/1492* (2013.01); *G06F 1/184* (2013.01); *H04Q 1/03* (2013.01); *H05K 7/18* (2013.01)

(58) Field of Classification Search
CPC .......... G06F 1/181; G06F 1/184; G06F 13/40; H05K 7/1491; H05K 7/1492; H05K 7/18; H02B 1/34; H04Q 1/03
See application file for complete search history.

(56) References Cited

U.S. PATENT DOCUMENTS

| | | | | |
|---|---|---|---|---|
| 6,052,281 | A * | 4/2000 | Hardt ...................... | G06F 1/181 361/679.33 |
| 6,542,363 | B2 * | 4/2003 | White ................. | F24F 13/1486 361/695 |
| 7,646,601 | B2 | 1/2010 | Zhang et al. | |
| 8,045,328 | B1 * | 10/2011 | Chen .................. | H05K 7/20727 165/121 |
| 8,711,569 | B2 | 4/2014 | Yi | |
| 2011/0116226 | A1 | 5/2011 | Yang | |

* cited by examiner

*Primary Examiner* — Adrian S Wilson
(74) *Attorney, Agent, or Firm* — Johnson Legal PLLC

(57) ABSTRACT

The invention relates to a rack-mountable server using one or more single board computers. A stackable mounting bracket for the single board computers allows multiple single board computers to be added to the server.

6 Claims, 5 Drawing Sheets

US 10,019,042 B1

SERVER USING SINGLE BOARD COMPUTER

FIELD OF THE INVENTION

Disclosed is a system and hardware for making a rack-mountable server based on one or more single board computers.

BACKGROUND OF THE INVENTION

Servers have generally been relatively powerful computers with a combination of hardware and software that serve a number of functions simultaneously in a business environment. Such servers often host and manage databases, internet traffic, print management, and read/write requests from multiple users. As a result, the typical business server has been configured with lots of random access memory (RAM), wide bus ports, and otherwise robust I/O hardware that fit into a rack-mountable chassis of standardized dimensions to fit within a rack enclosure that complies with the EIA-310 standard. The EIA-310 is a specification for what is often called the "standard rack". This specification standardizes several important features of 19" racks, such as the Rack Unit (RU or U), vertical hole spacing, horizontal hole spacing, rack opening and front panel width. The specification also sets tolerances on each of these dimensions. The only dimension on a 19" rack that actually measures 19" is the width of the front panel of equipment. A rack is secured in a "rack enclosure that is measured in height by units, designated "U" of 1.75 inches, as in, a rack enclosure of 44 U would hold 11 racks of 4 U each.

The conventional, robust, network servers may be, in many instances, far more than what a small business or home-based business needs or cares to spend for its relatively simple networking demands. In other instances, businesses may have a discrete need that could be managed by a server but at a value proposition that does not warrant a separate server box or a software license for a virtual server on one of the existing servers.

Various models of small-sized single board computer systems, such as the computers sold under the general name "Raspberry Pi" are widely available and gaining popularity in a variety of places beyond their original uses for low power hobbyist computers. The Raspberry Pi kits are based on a single board computer (SBC) having central and general processor units on a credit card-sized motherboard typically including four USB ports, an HDMI output connector for video, a mini USB port for power, RAM, a stereo jack, an ethernet connector, a micro SD slot for storage, and a 40 pin general purpose input/output (GPI/O) connector. Some newer versions have an integrated wireless networking system.

An SBC could be an excellent headless server where a keyboard, mouse, and monitor are not normally attached but can be attached when they are required. A significant hurdle to using the SBC as a headless server is that there is no current case that allows one or more SBCs to be mounted in a conventional data center rack, e.g., those that comply with EIA-310. Currently, long standoffs have been used with a plastic base plate for each SBC to form stacks of SBCs that are then connected to a network switch. In this arrangement, however, the various components connected by a collection of cables between the various components resting on a table top.

The current network room situation for SBC units relies on loose boxes that rest on other components or that are placed on adjacent tables with connection cables strung across the intervening space. This is inconvenient and awkward for the network administration staff while also making the unguided cables a hazard. All of these discourage the use of SBC servers in the business environment where rack enclosures are common. Thus, this failure for a rack mount means that the SBC is not used where power continuity, HVAC, and physical security are best centralized and assured.

Existing rack mountable computer servers also use substantial energy to power the central processing unit as well as all of the cooling devices that are needed to control the excess heat from the processor and ancillary boards in the server. Such conventional servers are more expensive than SBCs and make a lot of noise. The noise generated by the associated cooling systems is sufficient alone to preclude use of such servers outside a closed room. The power demands of such conventional servers are, in many instances, far in excess of the computing power that is actually required for the intended applications.

It would be desirable to have a rack-mountable case for one or more single board computers that would fit into a conventional rack mount stand of the type commonly used with more conventional multi-board computers.

It would also be desirable to have a rack-mountable chassis design that would not need to be mounted in a rack enclosure to be useful for its administrator.

SUMMARY OF THE INVENTION

It is an object to provide a mounting bracket that will secure one or more single board computers to an EIA-310 compliant rack-mountable chassis.

It is also an object of the invention to provide a rack-mountable chassis for at least one single board computer that will fit a conventional data center rack enclosure that complies with EIA-310.

It is further an object of the invention to provide a server made with one or more single board computers that is free or essentially free of any moving on a rack-mountable chassis that would fit an enclosure that complies with the EIA-310 standards for rack mount enclosures.

In accordance with these and other objects that will become apparent from the description herein, a mounting bracket according to the invention comprises a server comprising one or more single board computers, said server comprising:

(a) a chassis enclosure having top, bottom, front, rear, and side panels and exhibiting dimensions that comply with EIA-310 standards for mounting a rack-mountable chassis within a rack support;

(b) a generally rectangular, substantially planar, base bracket plate connected to said bottom panel of said chassis enclosure, said base bracket plate exhibiting two, generally rectangular, substantially parallel openings in said bracket plate to form substantially planar mounting surfaces on either side of said openings; said bracket plate having standoffs connected to said mounting surfaces on either side of said openings and thereby define four mounting positions that are dimensioned to receive a single board computer in each position;

(c) an HDMI video output port;
(d) a networking switch or hub; and
(e) a power supply.

Many applications for computer servers can be accommodated by a lower power single board computer. A server assembled with the brackets and rack-mountable chassis of the invention uses less energy, runs more quietly if not silently, and is less expensive to build than a conventional server. A server made according to the present invention has all of the components static, i.e., free or substantially free of moving parts, which makes the server suitable for use in a moving platform like an automobile, boat, or aircraft or in a gravity-free environment.

DETAILED DESCRIPTION OF THE INVENTION

Figure 1:
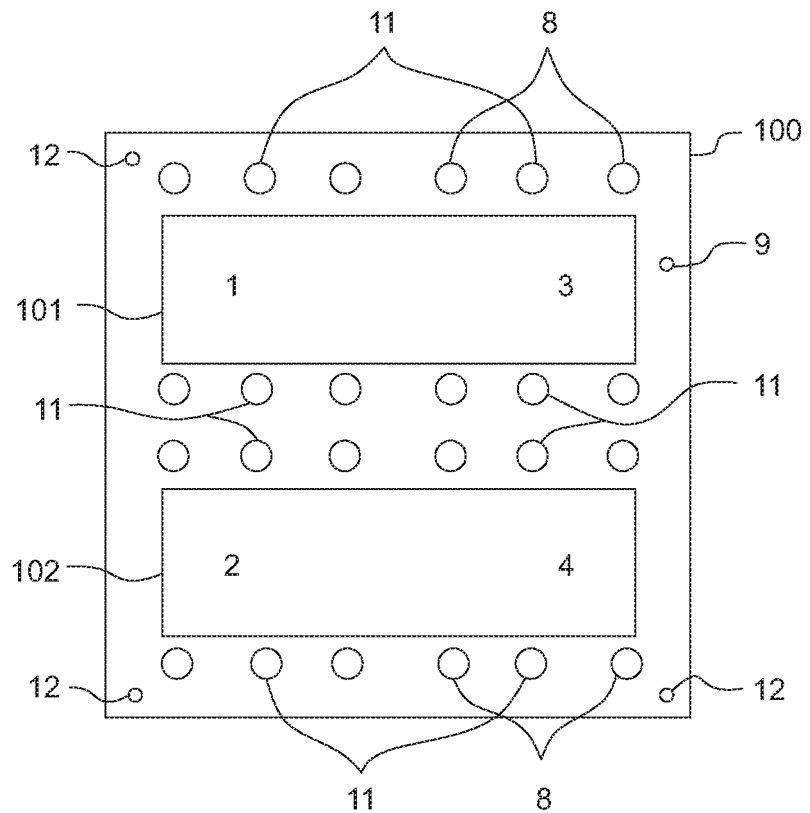
FIG. 1 shows a base bracket plate according to the invention.

The present invention includes at least one base bracket plate that secures a plurality of single board computers (SBCs) in a 1-4 RU, rack-mountable chassis that fits into an EIA-310 compliant rack enclosure. All of the SBCs have four holes at perimeter locations for securing the SBC within its case so each base bracket plate has at least one position where an SBC can be secured. Each base bracket plate can have 1-16 positions but more preferably has 1-8 or 1-4 positions for SBC attachment. Each position is characterized by a cutout in the bottom of the bracket portion to allow access to the underside of the mounted SBC and a set of four standoffs around the perimeter of the position at a location corresponding to the perimeter openings in the SBC board that are used for mounting.

The main SBC base bracket plate is stackable, with each level in the stack supporting four or more SBC cards, depending on the height of the rack chassis used. The base bracket plate is preferably attached to the chassis with at least one offset connector location so as to dictate a single orientation for the attached base bracket plate and to provide for consistent assembly.

A rack mountable chassis according to the invention comprises a base (or bottom) panel, two side panels, a lid or top panel, a front panel and a rear panel all assembled to form a container for one or more base bracket plates with attached single board computers. The chassis container is of such a size that it can be mounted in a standard 19" data center rack enclosure of open or closed design provided that it complies with the EIA-310 specifications. Computer and electronic components, connected to each other in order to function as a computer server, are affixed to brackets that are mounted on the panels of the chassis.

As shown in FIGS. 1-6, base bracket plate 100 includes positions 1, 2, 3 and 4 each adjacent to the other with two plate openings 101, 102 each spanning two positions, e.g., plate opening 101 spanning positions 1 and 3 with plate opening 102 stretching across opening 102. Plate openings 101 and 102 increase air space and allow better airflow under the SBCs for cooling. Plate openings 101, 102 also reduce the amount of material (e.g., metal or plastic) that is required to make the bracket. Base bracket plate 100 also allows base bracket plate 100 to be adapted for different types of SBCs. Without changing the outside chassis 400, different locations can be provided for the SBC holes 8 on the base bracket plate 100. This flexibility provides for a variety of servers based on various SBCs other than the Raspberry Pi. Suitable base plates 100 can be made for other SBCs such as Arduino, Pine64, and O-Droid. All of them can be accommodated in the same metal chassis 400 by just including a different cut on the base bracket plate 100.

Base bracket plate 100 is attached to the chassis base panel 200 with bracket mounting screws 5 through perimeter connection holes 12 in bracket plate 100. If desired, one or more perimeter connection holes 9 may be located at a position spaced apart from the edges of base bracket plate 100 to provide a key for consistent positioning of bracket plate 100 on chassis panel 200.

A single board computer 300 can be mounted onto any of positions 1-4 in base bracket plate 100 with SBC standoff screws 6 into corresponding standoffs 7 through SBC holes 8. Preferably, each mounting position for a single board computer 300 provides four standoffs 7 with two on each side of single board computer 300 in positions corresponding to SBC holes 8. With a Raspberry Pi device, the positions and locations are consistently positioned so bracket plate 100 can be reliably configured to mount such SBC devices. Base bracket plate 100 may also be provided with optional SBC holes 11 in locations useful for various types of SBC devices made by other manufacturers.

Standoffs 7 are preferably conventional, conductive, computer case standoffs having a lower, male-threaded, portion and an upper, female-threaded, portion. SBC mounting screws 6 fit into the top of standoffs 7 through SBC holes 8 and secure the single board computer 300 to chassis base panel 200. Standoffs 7 also allow multiple base bracket plates 100 to be stacked, one on top of the other, using a second set of standoffs 7 reaching through SBC holes 8 into a lower set of standoffs 7 to secure the first set of SBCs 300 and providing threaded, female connection points for a second or subsequent row of SBCs 300.

While it is not preferred in a single rack unit chassis (1 RU=1.75" height), a 2 RU chassis will allow plenty of room for stacking a second layer of SBCs when using standoffs to mount the bottom layer to the base bracket plate. The top layer would be mounted using screws on the top of the standoffs. This standoff length is 41 mm (1.61"), which will provide plenty of clearance for the first layer of four SBCs which are 18.8 mm (0.739") in height. That will leave plenty of clearance between the bottom layer and the top layer in a 2 RU chassis.

Figure 2:
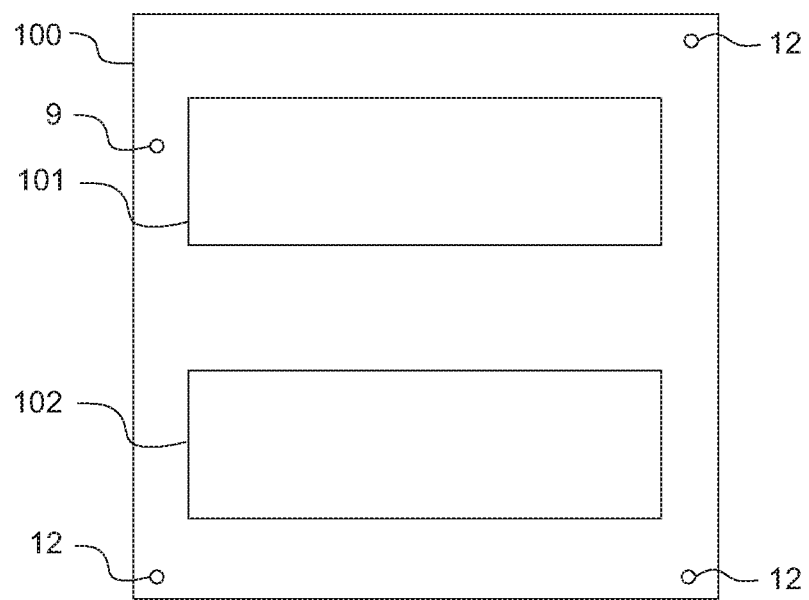
FIG. 2 presents a bottom view of the base bracket plate of FIG. 1.
Figure 3:
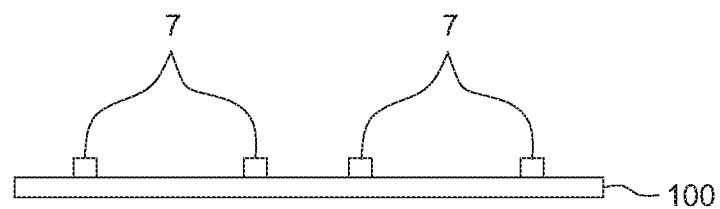
FIG. 3 is a side view of the base bracket plate shown in FIG. 1.
Figure 4:
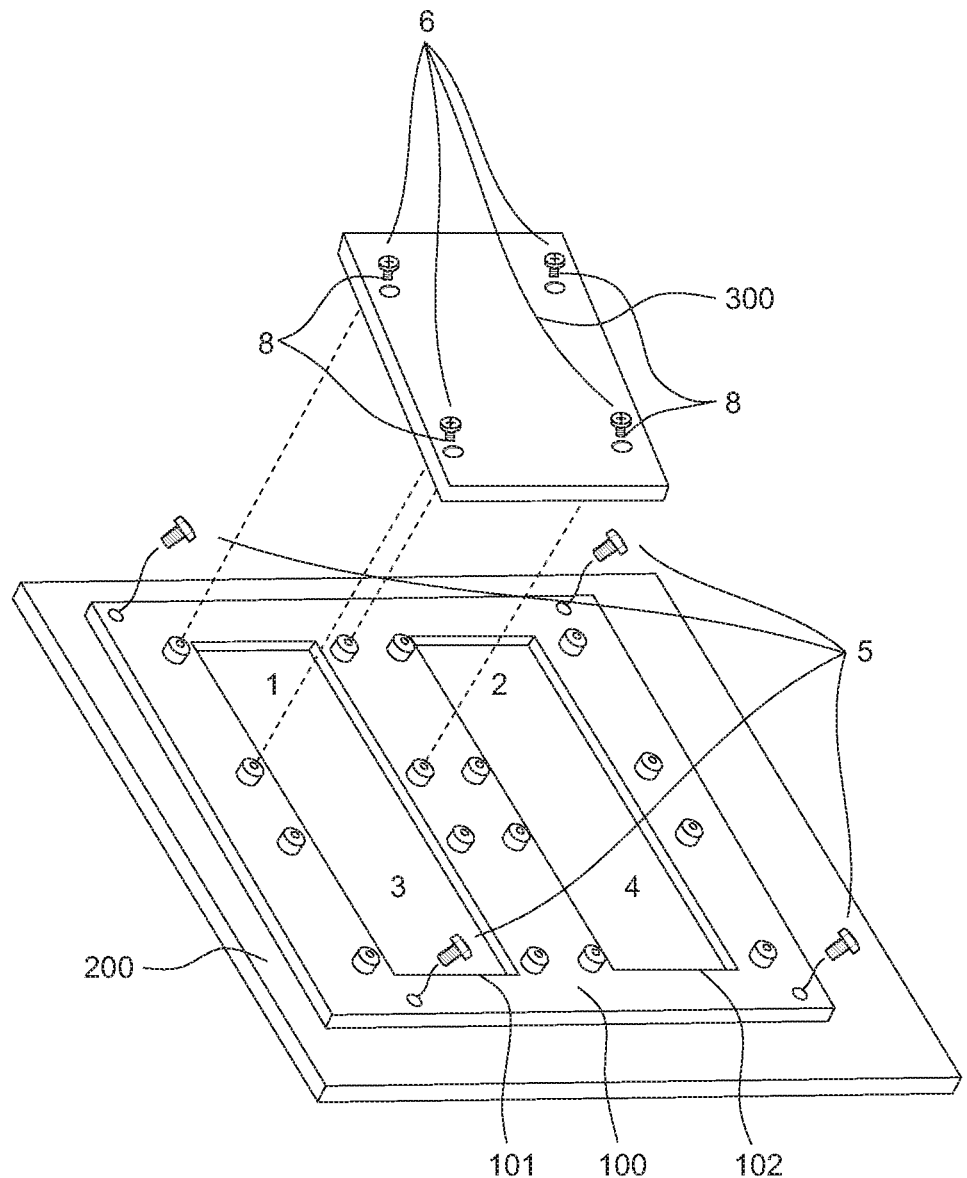
FIG. 4 depicts the base bracket plate of FIG. 1 on a rack-mountable chassis and illustrates how a single board computer would be attached to one of four positions on the base bracket plate.

As shown in FIGS. 1, 2 and 4, bracket mounting screws 5 connect base bracket plate 100 to chassis base panel 200 through holes 9 and 12 along the perimeter of bracket 100.

Figure 5:
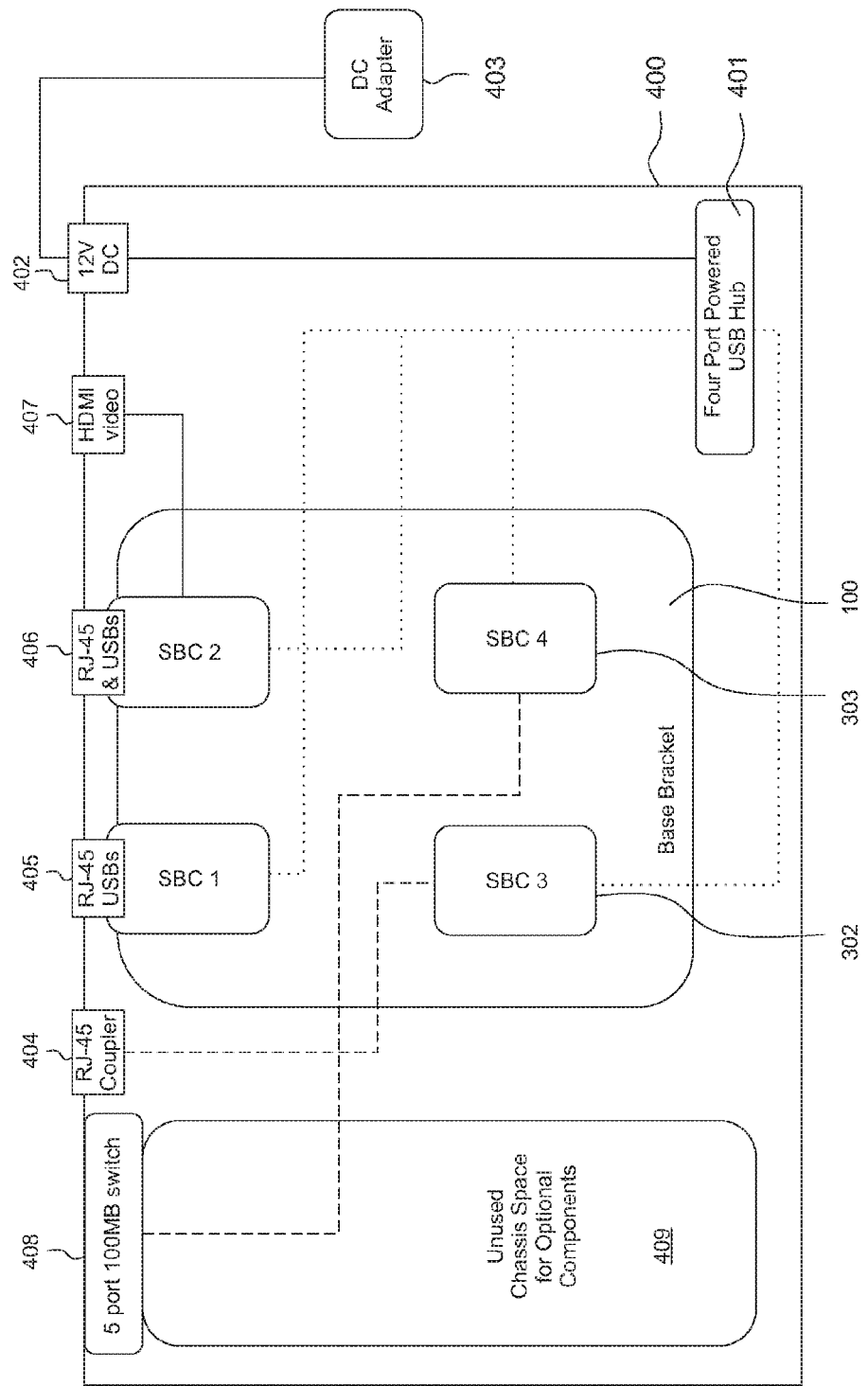
FIG. 5 shows four single board computers mounted on the rack chassis with connections to a power adapter, a powered USB hub, RJ-45 connectors, an HDMI video port and a networking switch.

FIG. 5 shows a preferred layout for a server according to the invention. Chassis 400 houses base bracket plate 100 onto which are mounted SBCs 300, 301, 302, 303 in positions 1, 2, 3 and 4, respectively. Base bracket plate 100 is itself mounted to base chassis panel 200. Power for each SBC is provided with USB hub 401 that is powered by a 12 volt DC source connection 402 and a DC adapter 403. A plurality of connection ports 404, 405, 406, 407 can be used to connect to a single board computer for network connections with RJ-45 or universal serial bus (USB) connectors 404, 405, 406 or a video connection such as HDMI connector 407. Networking switch 408, preferably a 5-port, 100 MB switch can be connected to one of the SBCs with an internally-accessible network connection port, such as SBC 303 to provide the server with additional network connection ports. In the preferred embodiment of a rack-mountable chassis shown in FIG. 5, there remains unused chassis space 409 for additional components to the chassis, e.g. external storage, RF transceiver, proprietary antivirus or internet traffic monitoring boards, etc.

Figure 6:
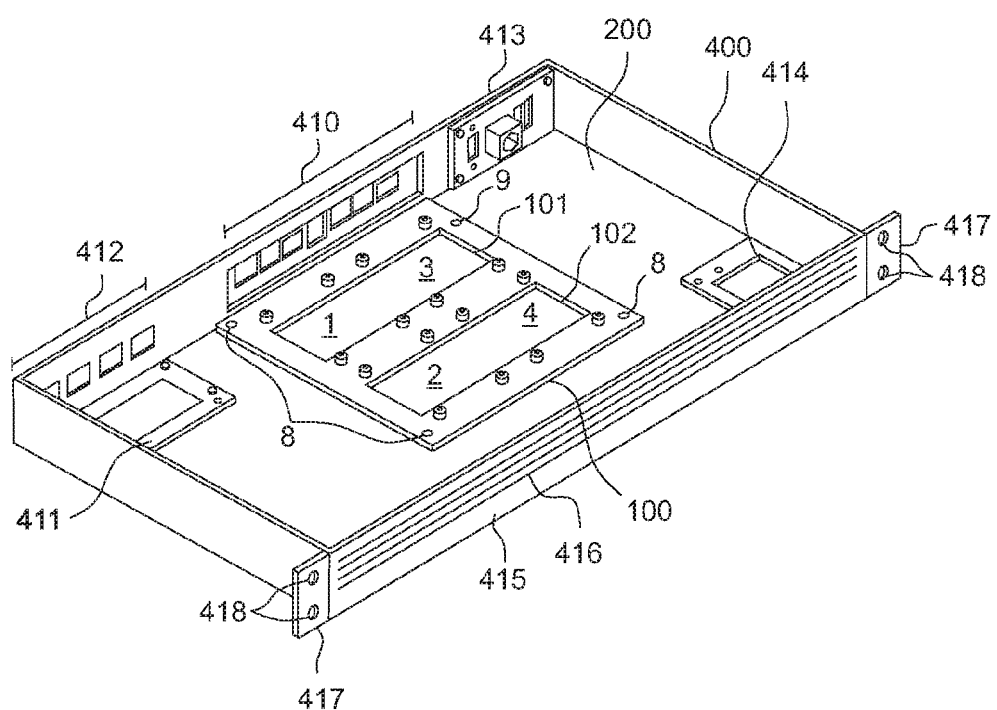
FIG. 6 depicts a 1 U server rack and a mounting plate bracket for up to four single board computers according to the invention.

FIG. 6 is an isometric view that shows base bracket plate 100 mounted to chassis panel 200 adjacent a first set of connection openings 409. These openings can be used to mount connectors, such as connectors for RJ-45, USB, and HDMI inputs and outputs. Connection bracket 411 and corresponding second set of connection openings 412 are also provided for network switch 408. A power supply connection opening 413 is also provided for a suitable power supply, e.g., a 12 volt DC source. USB hub bracket 414 is also mounted to chassis base plate 200 to secure a powered USB hub (not shown) to the server. Ventilated front plate 415 has a series of slots 416 that allow air exchange with the components inside chassis 400. Server mounting brackets 417 provide through holes 418 to mount chassis 400 in a conventional network rack (not shown).

The present invention provides a number of potential commercial applications with good economic potential. For example, the server of the invention can be used as a server for email, name resolution, address assignment, network time, web page, or a combination of services. Such servers present unique benefits for hobbyists and tech users; small to medium businesses; and businesses in specialty segments such as transportation, audio/video, photography, aerospace, remote exploration, and those required to operate in harsh environments where moving parts would vulnerable to fouling or corrosion. The hobbyist or tech user can use the invention to build their own system or just experiment. Small to medium businesses can use the invention in their office for printing, email, internet traffic, voice mail, copier controls, interoffice communications coordination, and similar tasks that are generally not processor intensive. Scientists and field researchers may find the present invention useful to control or monitor exploration equipment that may be exposed to extremes of pressure, high or low that might otherwise interfere with computing system that required vent fans and similar moving parts for continued operation.

What is claimed is:

1. A server comprising one or more single board computers, said chassis comprising:
   a. a chassis enclosure having top, bottom, front, rear, and side panels and exhibiting dimensions that comply with EIA-310 standards for mounting a rack-mountable chassis within a rack support;
   b. a generally rectangular, substantially planar, base bracket plate connected to said bottom panel of said chassis enclosure, said base bracket plate exhibiting two, generally rectangular, substantially parallel openings in said bracket plate to form substantially planar mounting surfaces on either side of said openings; said bracket plate having standoffs connected to said mounting surfaces on either side of said openings and thereby define four mounting positions that are dimensioned to receive a single board computer in each position;
   c. an HDMI video output port;
   d. a networking switch or hub; and
   e. a power supply.

2. A server chassis according to claim 1 wherein said base bracket plate is made of a plastic material.

3. A server chassis according to claim 2 further comprising a single board computer mounted in one of said four positions on said base bracket plate and electrically connected to said power source and said HDMI port.

4. A server chassis according to claim 2 further comprising a single board computer mounted in two of said positions on said base bracket plate, wherein each is electrically connected to said power source, and one of said single board computers is connected to said HDMI port and the other is connected to said networking switch or hub.

5. A server chassis according to claim 1 wherein said power source comprises a powered, universal serial bus, hub that is connected to a source of 12 volt DC current.

6. A server according to claim 1 wherein each single board computer comprises an RJ-45 networking port.

* * * * *